United States Patent
Lin et al.

(10) Patent No.: US 8,335,327 B2
(45) Date of Patent: Dec. 18, 2012

(54) AUDIO SIGNAL AMPLIFIER FOR KARAOKE PLAYER

(75) Inventors: Gaile Lin, Shenzhen (CN); Hong Guan, Shenzhen (CN); Qun Zhong, Shenzhen (CN)

(73) Assignee: CSR Technology Inc., Sunnyvale, CA (US)

( * ) Notice: Subject to any disclaimer, the term of this patent is extended or adjusted under 35 U.S.C. 154(b) by 0 days.

(21) Appl. No.: 12/279,313

(22) PCT Filed: Apr. 18, 2008

(86) PCT No.: PCT/CN2008/000807
§ 371 (c)(1),
(2), (4) Date: Aug. 13, 2008

(87) PCT Pub. No.: WO2009/127086
PCT Pub. Date: Oct. 22, 2009

(65) Prior Publication Data
US 2011/0150244 A1   Jun. 23, 2011

(51) Int. Cl.
*H03F 99/00* (2009.01)
(52) U.S. Cl. ............ 381/120; 381/119; 381/28; 381/81; 84/610; 84/625; 84/660
(58) Field of Classification Search ............ 381/119, 381/120, 28, 123, 81; 704/216, E19.001; 84/610, 631, 625, 660
See application file for complete search history.

(56) References Cited

U.S. PATENT DOCUMENTS

| | | | | |
|---|---|---|---|---|
| 7,068,596 B1 * | 6/2006 | Mou | ............ | 370/229 |
| 7,894,772 B2 * | 2/2011 | Aoki | ............ | 455/63.1 |
| 2002/0189429 A1 * | 12/2002 | Qian et al. | ............ | 84/610 |
| 2006/0018496 A1 * | 1/2006 | Niederdrank et al. | ........ | 381/312 |
| 2008/0165994 A1 * | 7/2008 | Caren et al. | ............ | 381/312 |

FOREIGN PATENT DOCUMENTS

| | | |
|---|---|---|
| CN | 1156294 A | 8/1997 |
| CN | 1845642 A | 10/2006 |
| JP | 07013579 A | 1/1995 |
| JP | 08146979 A | 6/1996 |
| JP | 11075286 A | 3/1999 |
| JP | 11095764 A | 4/1999 |
| JP | 11167385 A | 6/1999 |
| JP | 2000298490 A | 10/2000 |
| JP | 2005201966 A | 7/2005 |

OTHER PUBLICATIONS

International Search Report & Written Opinion for International Application No. PCT/CN2008/000807, dated Feb. 5, 2009.

* cited by examiner

*Primary Examiner* — Disler Paul
(74) *Attorney, Agent, or Firm* — Morgan, Lewis & Bockius LLP

(57) ABSTRACT

A configurable amplifier circuit for a karaoke player is described. In one embodiment, a karaoke player includes: a DVD/CD reader port for coupling to a DVD/CD reader, a microphone input to receive audio signals from an external microphone, an MPEG decoder coupled to the DVD/CD reader port and the microphone input, the MPEG decoder having first and second output terminals, a processor coupled to the MPEG decoder, the processor to control the MPEG decoder, and a configurable amplifier coupled to the first and second output terminals, wherein a first audio signal originating from the first output terminal is selectively amplified by the configurable amplifier circuit in accordance with a second signal originating from the second output terminal.

24 Claims, 6 Drawing Sheets

|  | Output 1 (OT1) | Output 2 (OT2) | Ga | Gf | Amplified Output (AO) |
|---|---|---|---|---|---|
| Audio Mode - DVD/CD only | S | On | 1 | 2 | (OT1)GaGf = 2S |
| Karaoke Mode - DVD/CD only | S/2 | Off | 1 | 2 | (OT1)2GaGf = 2S |
| Karaoke Mode - DVD/CD & Voice | S/2 + V | Off | 1 | 2 | (OT1)2GaGf = SGaGf + 2VGaGf = 2S + 4V |

Fig. 6A

| Output 2 = Analog Signal | | | | | |
|---|---|---|---|---|---|
|  | Output 1 (OT1) | Output 2 (OT2) | Ga | Gf | Amplified Output (AO) |
| Audio Mode - DVD/CD only | S | none | 1 | 2 | (OT1)GaGf = 2S |
| Karaoke Mode - DVD/CD only | S/2 | S/2 | 1 | 2 | (OT1)GaGf = 2S |
| Karaoke Mode - DVD/CD & Voice | S/2 + V | S/2 + V | 1 | 2 | (OT1)2GaGf = SGaGf + 2VGaGf = 2S + 4V |

Fig. 6B

AUDIO SIGNAL AMPLIFIER FOR KARAOKE PLAYER

TECHNICAL FIELD

The disclosed embodiments related generally to the field of audio signal amplification and to circuitry for amplifying audio signals from a DVD/CD reader and microphone.

BACKGROUND

Karaoke is a form of entertainment in which individuals sing along with recorded music. A Karaoke player plays recorded music, typically from a CD or DVD, and mixes the recorded music with audio input from a microphone. As discussed below in the detailed description, when a karaoke player is used solely to playback music (or other audio program) from a CD or DVD, it may be expected to conform to commercial standards or other predefined standards for CD or DVD players. When used for karaoke, the karaoke player amplifies both an audio signal received from a microphone and an audio signal from the CD or DVD.

SUMMARY OF EMBODIMENTS

In some embodiments, an apparatus includes a DVD/CD reader port for coupling to a DVD/CD reader, a microphone input to receive audio signals from an external microphone, and an MPEG decoder coupled to the DVD/CD reader port and the microphone input, the MPEG decoder having first and second output terminals. The apparatus further includes a processor coupled to the MPEG decoder, the processor to control the MPEG decoder, and a configurable amplifier coupled to the first and second output terminals of the MPEG decoder. A first audio signal originating from the first output terminal is selectively amplified by the configurable amplifier circuit in accordance with a second signal originating from the second output terminal.

In some embodiments the second signal from the MPEG decoder has a state that is controlled by the presence or absence of an external microphone. In other embodiments, the configurable amplifier circuit has an adjustable gain amplifier stage controlled by the second signal, and a fixed gain amplifier. The adjustable gain amplifier stage may be connected in series with the fixed gain amplifier stage.

In some embodiments, when the first signal is originated from a single source, the second signal has a value corresponding to a first mode and an amplified output of the configurable amplifier circuit has a signal to noise ratio meeting a predefined Dolby signal-to-noise requirement. In other embodiments, when the first signal is originated from multiple sources, including an external microphone, the second signal has a value corresponding to a second mode and an amplified output of the configurable amplifier circuit has a signal to noise ratio that fails to predefined Dolby signal-to-noise requirement.

In some embodiments, the MPEG decoder in the apparatus further includes an internal direct digital amplification (DDX) audio digital-to-analog converter (audio DAC) having an output coupled to the first output terminal of the MPEG decoder. In other embodiments the processor coupled to the MPEG decoder configures the second signal into a first value corresponding to a first mode of operation and configures the second signal to have a second value corresponding to a second mode of operation so as to selectively control the gain of the adjustable gain amplifier stage.

BRIEF DESCRIPTION OF THE DRAWINGS

FIG. 6A is a table representing values at various points of a signal flow path being amplified by the circuitry illustrated in FIG. 4 in accordance with some embodiments.

FIG. 6B is a table representing values at various points of a signal flow path being amplified by the circuitry illustrated in FIG. 5 in accordance with some embodiments.

Like reference numerals refer to corresponding parts throughout the drawings.

DESCRIPTION OF EMBODIMENTS

Some karaoke players serve as both a DVD/CD player and a karaoke player. Most DVD/CD players are designed to satisfy certain audio output requirements, such as the Dolby signal-to-noise ratio (SNR) requirement of 65 dB. Adherence to this requirement effectively limits the maximum amplification for any given power supply voltage. Some of the embodiments described below adhere to one or more audio output requirements established by one or more standard bodies while the circuitry operates in a first mode (e.g., music playback mode, or DVD/CD mode), but do not adhere to one or more of the same audio output requirements when the circuitry operates in a second mode (e.g., karaoke mode).

Figure 1:
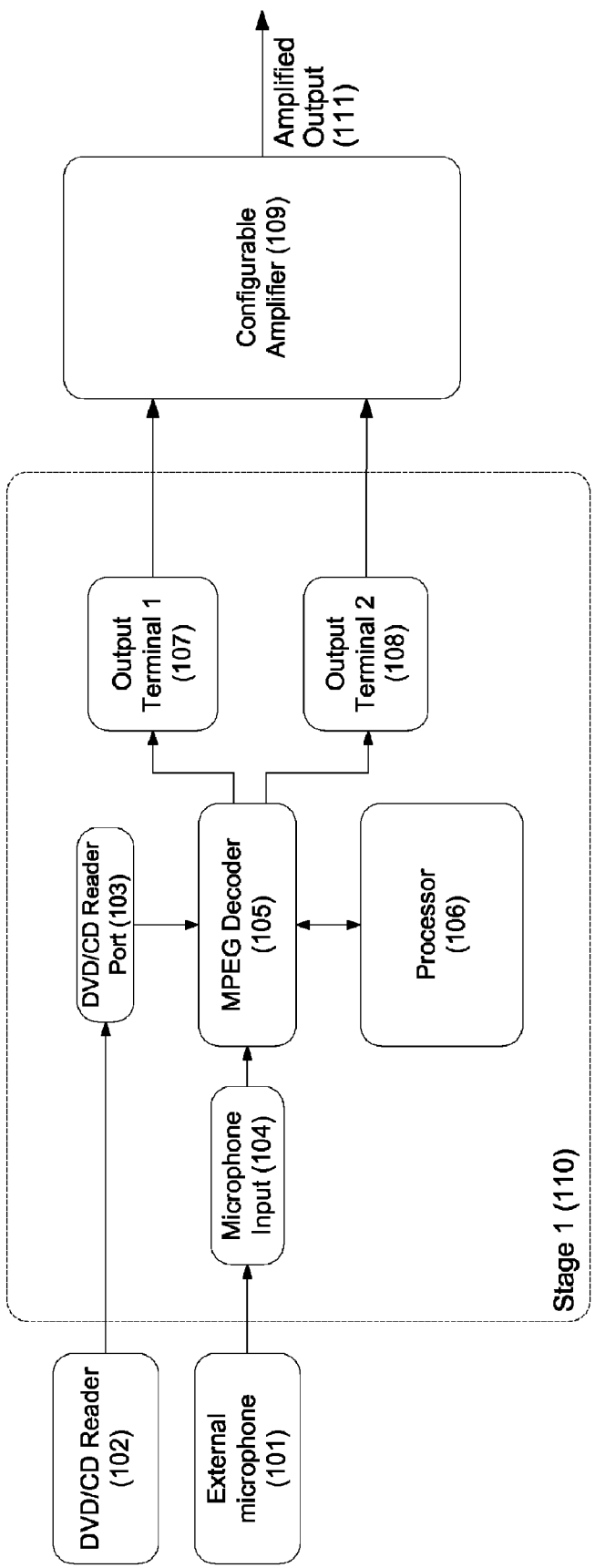
FIG. 1 is a block diagram of a signal flow path for signal amplification in accordance with some embodiments.

FIG. 1 is a block diagram of a signal flow path for signal amplification in accordance with some embodiments. In these embodiments, signals generated by a DVD/CD reader 102 and/or external microphone 101 are processed in an MPEG decoder 105 under instructions from a processor 106. The processed signal(s) from the MPEG decoder 105 are amplified by a configurable amplifier 109 to produce an amplified output 111, which is then transmitted to loudspeakers or the like for conversion from electrical signals into audio signals.

In some embodiments, the DVD/CD reader 102 and external microphone 101 both produce analog signals. The DVD/CD signal is converted into a digital signal before being received by the MPEG decoder 105. Alternately, the MPEG decoder 105 receives an analog signal from the DVD/CD reader 102 and has an analog-to-digital converter to convert the analog signal into a digital signal. Similarly, an analog signal produced by an external microphone 101 may be converted into a digital signal before the signal is received by the MPEG decoder 105. Alternately, the analog signal from the microphone 101 may be converted into a digital signal by an analog-to-digital converter internal to the MPEG decoder 105. The signal from the DVD/CD reader 102 enters the MPEG decoder 105 through a DVD/CD reader port 103 while the audio signal from the external microphone 101 enters the MPEG decoder 105 via a microphone input 104. Once converted from an analog signal into a digital signal, one or both of the signals from the microphone 101 and the DVD/CD reader 102 are processed by the digital signal processor in the MPEG decoder 105.

The MPEG decoder 105 is coupled to a processor 106, which executes a control program and produces one or more control signals that control operation of the MPEG decoder 105. When the MPEG decoder 105 and processor 106 are embedded in a device with a user interface, the processor 106 may also be used to relay commands, issued by a user through the user interface, to instruct the MPEG decoder 105 to perform processing on the signals from the DVD/CD reader 102 and/or microphone 101. For instance, a user may instruct the MPEG decoder 105 to adjust (increase or decrease) the gain of the signals received from DVD/CD 102 reader only, to adjust the gain of the signals received from the external microphone 101 only, or to adjust the gain of both signals. Similarly, the processor 106 may send instructions to the MPEG decoder 105 when the presence of an external microphone 101 is detected (i.e., when an active external microphone is electrically coupled to the MPEG decoder 105). Alternately stated, the processor 106 may issue one set of instructions to the MPEG decoder 105 when an active external microphone 101 is present (i.e., electrically coupled to the MPEG decoder 105), and a second set of instructions when an external microphone is absent (i.e., is not electrically coupled to the MPEG decoder 105).

In some embodiments, when an external microphone that is turned off is coupled or connected to the MPEG decoder 105, the microphone's presence is not detected and the microphone is treated as being absent. In effect, a microphone that is turned off does not function as a microphone for purposes of determining the karaoke player's mode of operation.

A configurable amplifier 109 is coupled to the output of the MPEG decoder 105. The gain of the configurable amplifier 109 is directly controlled by at least one of the outputs from the MPEG decoder 105. The gain of the configurable amplifier 109 is adjustable and is selected or chosen depending on at least one signal output by the MPEG decoder 105. In some embodiments, the MPEG decoder 105 outputs distinct first and second output signals on output terminal 1 (107) and output terminal 2 (108), respectively. In one embodiment, both output signals are analog signals. In another embodiment, one output signal from the MPEG decoder 105 is an analog signal while another output signal from the MPEG decoder 105 is a logic signal. The amplified output 111 produced by the configurable amplifier 109 is the amplified output of at least one of the output signals exiting the MPEG decoder 105. In one embodiment in which both output signals from the MPEG decoder 105 are analog signals, the amplified output 111 is the amplified version of at least one of the two signals, and the amount of amplification performed by the configurable amplifier 109 is controlled by the presence, or value of, the second signal. Alternately, in an embodiment in which one output from the MPEG decoder 105 is an analog signal and another is a logic signal, the logic signal is used to configure and adjust the gain of the configurable amplifier 109, which amplifies the analog signal (from the MPEG decoder 105) to produce the amplified output 111.

In some embodiments, the processor 106, the MPEG decoder 105, the DVD/CD reader 102, the microphone input 104, the output terminal 1 (107) and output terminal 2 (108), illustrated together as stage 1 (110), are implemented as circuitry on a single semiconductor chip and the configurable amplifier 109 is implemented on a separate and independent semiconductor chip. In other embodiments, the circuitry of stage 1 (110) and the configurable amplifier 109 are implemented together on a single semiconductor chip.

Figure 2:
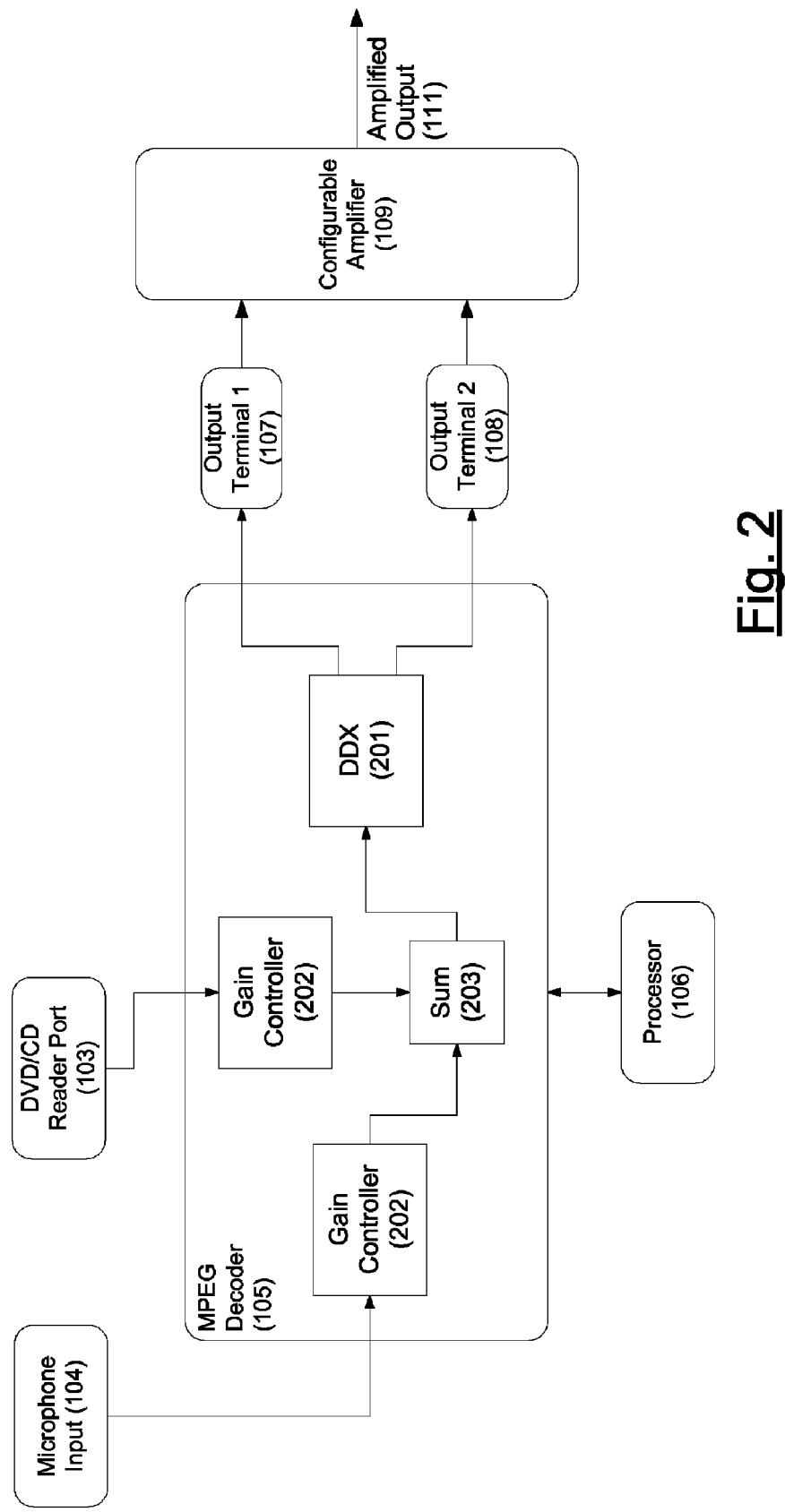
FIG. 2 is a block diagram of a signal flow path through an MPEG decoder having an internal direct digital amplification (DDX) and digital to analog converter (DAC) component in accordance with some embodiments.

FIG. 2 is a block diagram of a signal flow path through an MPEG decoder having an internal direct digital amplification (DDX) component that includes a digital to analog converter (DAC). In some embodiments, the MPEG decoder 105 that is used for processing the signals from the DVD/CD reader 102 and the external microphone 101 may contain at least an internal DDX 201 with a DAC. The DDX 201 may function as both a digital amplifier and a DAC. In other words, a digital signal input into DDX 201 will be amplified and converted into an analog signal at the output of the DDX 201. In some embodiments, DDX 201 is an all-digital, high efficiency amplifier that can be used for a wide range of audio applications.

In addition to DDX 201, the MPEG decoder 105 may also include a digital signal processor (DSP) (not shown), a gain controller 202 for each of the signals from the DVD/CD reader port 103 and the microphone input 104, and an adder 203. The DSP is used to process digital signal(s) from the DVD/CD reader 102 and the external microphone 101. As noted above, the outputs of the DVD/CD reader 102 and/or external microphone 101 may be analog signals that require conversion to digital signals prior to processing by the MPEG decoder 105. In one embodiment, the gain controllers 202 operate in accordance with instructions received from the processor 106. For instance, when a user adjusts the volume of the audio output of the DVD/CD reader 102, the volume of the audio output of the external microphone 101, or both (e.g., by twisting one or more knobs, or moving sliders, or otherwise manipulating the user interface of a karaoke player or other device), the processor 106 appropriately adjusts the gain in the corresponding gain controller(s) 202 that are for the DVD/CD signal and the microphone signal. In some embodiments, the processor 106 determines if there is an external microphone signal by detecting if there is a contribution from an external microphone signal at the adder 203.

Two outputs from the DDX 201 are inputs to the configurable amplifier 109. The configurable amplifier 109 amplifies at least one of the output signals from the DDX 201 to generate the amplified output 111. A first of the two output signals from the DDX 201 is a signal containing only the DVD/CD signal or a combination of the DVD/CD signal and the microphone signal. A second output signal from the DDX 201 is used to selectively control the gain of the configurable amplifier 109, based on the presence or absence of a contribution from the external microphone.

In one embodiment, the gain of the configurable amplifier 109 is set at one value when both the DVD/CD signal and the external microphone signal are both present in the first output, and is set at a different value when the DVD/CD signal is present but the external microphone signal is absent in the first output. As noted above, in some embodiments the presence or absence of the external microphone signal is determined by detecting the presence or absence of an electrical signal from the external microphone at the adder 203. In other embodiments, this is determined by detecting the presence or absence of an electrical signal at the microphone input 104, or alternately by detecting the presence or absence of an electrical coupling at another part of the device in which the MPEG decoder 105 is embedded.

The gain of the configurable amplifier 109 is set at a first value when it is detected that an external microphone is coupled to the MPEG decoder 105 (or, alternately stated, that an external microphone is coupled to the karaoke player or other device in which the MPEG decoder is embedded). The gain of the configurable amplifier 109 is set at a second value (different from the first value) when it is detected that an external microphone is not coupled to the MPEG decoder 105.

In some embodiments, the gain of the configurable amplifier 109 is indirectly affected by the presence or absence of the external microphone 101 or the presence or absence of a signal originating from the external microphone 101, as indicated by the state of the second input from DDX 201. Therefore the second input from DDX 201 directly controls or selects the gain of the configurable amplifier 109.

Figure 3:
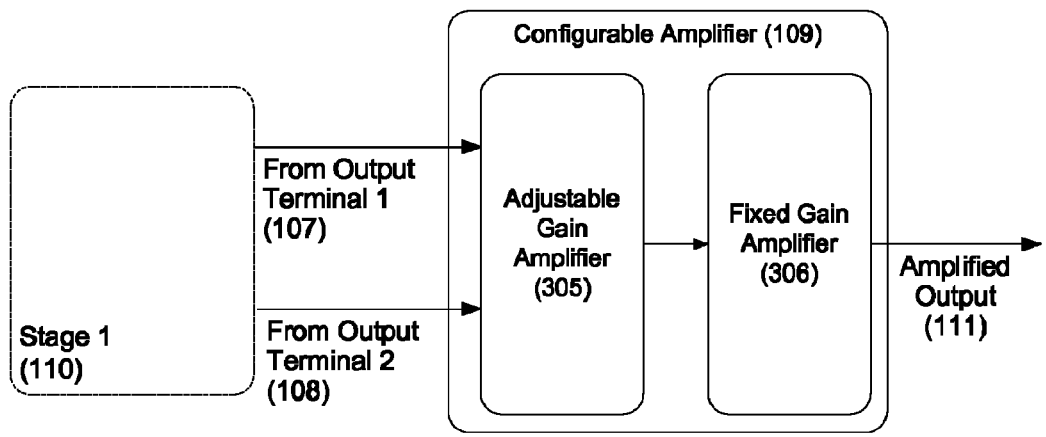
FIG. 3 is a block diagram of a circuit configuration having two signal outputs coupled to a configurable amplifier that can be viewed as a combination of an adjustable gain amplifier with a fixed gain amplifier in accordance with some embodiments.

FIG. 3 is a block diagram of a circuit having two signal outputs coupled to a configurable amplifier that can be viewed as a combination of an adjustable gain amplifier 305 and a fixed gain amplifier 306 in accordance with some embodiments. Viewing the MPEG decoder 105 (FIG. 1), the microphone input 104, the DVD/CD reader port 103, the processor 106, the two output terminals 107, 108 and any associated components collectively as stage 1 (110), FIG. 3 illustrates two signals, one from each of the output terminals 107, 108, going from stage 1 (110) into the configurable amplifier 109 to produce an amplified output 111.

In some embodiments, the configurable amplifier 109 includes an adjustable gain amplifier or stage 305 and a fixed gain amplifier or stage 306. In some embodiment, the adjustable gain amplifier or stage 305 and the fixed gain amplifier or stage 306 are connected in series. As noted earlier, one of the two outputs from the output terminals of the MPEG decoder 105 is used to configure the gain of the configurable amplifier 109. In these embodiments, that output may be viewed as controlling the gain of the adjustable gain amplifier or stage 305. The fixed gain amplifier or stage 306 that is connected in series with the adjustable gain amplifier 305 further amplifies the output from the adjustable gain amplifier 305.

Figure 4:
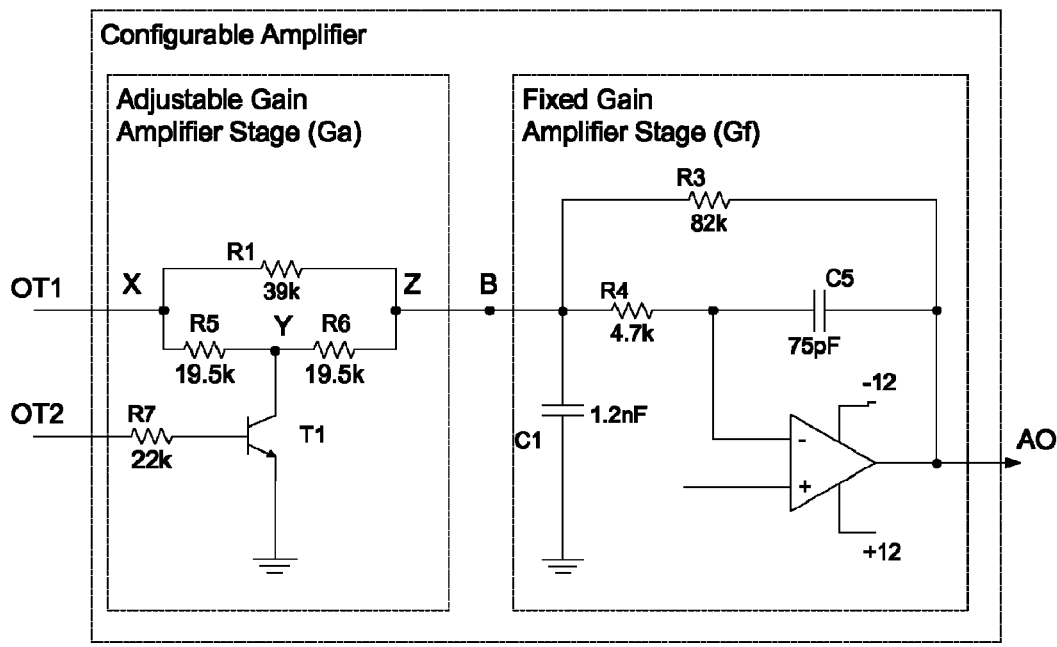
FIG. 4 depicts an example of configurable amplifier circuitry having an analog input and a logic input, and an adjustable gain amplifier followed by fixed gain amplifier in accordance with some embodiments.

FIG. 4 depicts an example of a configurable amplifier circuit, which may also be viewed as an amplifier circuit with an adjustable gain amplifier stage and a fixed gain amplifier stage connected in series in accordance with some embodiments. As described next, the gain of the configurable amplifier is controlled by the ratio of resistances in the adjustable amplifier stage and in the fixed amplifier stage. In particular, a logic signal from the MPEG decoder controls the resistance of the first amplifier stage and thereby controls the ratio of the resistances in the first and second stages, which in turn controls the gain of the configurable amplifier.

The two stages of the configurable amplifier are separated by a node or connector "B". The first stage receives two input signals from the MPEG decoder: an analog input from output terminal 1, OT1, and a logic input from output terminal 2, OT2. The analog signal from OT1 may include contributions from the DVD/CD reader or the external microphone, or both. The logic signal from OT2 is used to control the gain (or, more accurately, the resistance) of the first stage of the circuit.

In one embodiment, when the logic signal at OT2 is high (e.g., 5V), transistor T1 is turned "on" and point "Y" on the circuit is essentially grounded. As a result, the resistance between nodes "X" and "Z" is equivalent to the resistance of resistor R1. However, when the logic signal at OT2 is low (e.g. 0V), the transistor T1 is turned "off," enabling the voltage on node "Y" to float. As a result, the resistance between nodes "X" and "Z" is reduced by half, because the resistor R1 is connected in parallel with resistors R5 and R6. Thus, the first stage of the amplifier may be viewed as an having adjustable resistance, controlled by the logic signal from OT2. The second stage of the amplifier circuitry has a fixed resistance, and in combination with the variable resistance in the first stage, the gain of the signal from OT1 is approximately two (e.g. 82 k/39 k) when the logic signal at OT2 is high and is approximately four (e.g. 82 k/19.5 k) when the logic signal at OT2 is low. In other words, the overall gain of the amplified output signal at AO is approximately two (2) when the logic signal OT2 is high and is approximately four (4) when the logic signal OT2 is low. The gain of the configurable amplifier is therefore adjusted in accordance with the resistance in the adjustable amplifier stage. Stated in another way, the gain of the configurable amplifier is directly related to the resistance of the adjustable amplifier stage.

In one embodiment, in a normal audio operation mode in which the DVD/CD reader is active, the maximum output of OT1 at point "X" is approximately 1V rms. In this mode, the gain of the configurable amplifier is about two, and thus the amplified output AO is approximately 2V rms, or about twice the input. However, in the karaoke operation mode, in which there are contributions to signal on OT1 from both the DVD/CD reader and the external microphone, the amplified output AO is approximately four times the signal from OT1, and has a maximum output of approximately about 4V rms.

To satisfy the Dolby SNR requirement, the amount of noise in portion of the amplified output signal that is derived from the DVD/CD signal must be limited. In normal audio operation, the signal at the amplified output AO, is based entirely on input from the DVD/CD reader. In the embodiment described above, the output signal OA meets the Dolby SNR requirement of 65 dB because the noise in the output signal is approximately 106 μV rms, which is below the limit of 112 μV rms, for an amplified output of approximately 2V rms. However, in the karaoke mode, in which there is a contribution from an external microphone, the amplification is increased (e.g., by a factor of approximately two), and the noise in the output signal is correspondingly increased by about the same amount. As a result, without compensation, the noise in the output signal AO would be increased to approximately 212 μV rms, which would cause the amplified output to fail the Dolby requirement.

In one embodiment, to solve this problem, the MPEG decoder reduces the contribution of the DVD/CD reader to the signal at OT1 during karaoke mode. This compensates for the increase in amplification by the configurable amplifier during karaoke mode. For example, while in karaoke mode, as the amplification is increased by a factor of two in the configurable amplifier, the signal from the DVD/CD reader is reduced by a factor of two at the MPEG decoder to compensate for the increased gain. In some embodiments, the reduction of the signal from the DVD/CD reader may occur at the gain controller 202 (FIG. 2) associated with the DVD/CD reader. By reducing the DVD/CD signal by a predetermined factor that corresponds to the increase in amplification of the DVD/CD signal, the amplified DVD/CD signal in the karaoke mode remains the same as in the normal operation mode, and therefore the noise level associated with the amplified DVD/CD signal continues to meet the Dolby SNR requirement. Since the Dolby SNR requirement does not govern the portion of the signal contributed by the external microphone, noise from the external microphone does not violate the Dolby SNR requirement.

FIG. 6A is a table representing values at different points or portions of a signal flow path, in which an audio signal is amplified by the circuitry illustrated in FIG. 4. For purposes of this example, it is assumed that the MPEG decoder and the configurable amplifier are embedded in a karaoke player having multiple modes of operation. As described earlier with reference to FIG. 4, the gain of the configurable amplifier is controlled by the ratio of resistances in the adjustable amplifier stage and in the fixed amplifier stage. In this embodiment, the second output (OT2) of the MPEG decoder is a logic signal (e.g., having a value of On or Off), while the first output (OT1) of the MPEG decoder is an analog signal having a contribution from a DVD/RD signal S, and in some modes also having a contribution from an external microphone signal V. The table in FIG. 6A represents values of the circuit when one of the outputs of the MPEG decoder is a logic signal. The left most column of the table in FIG. 6A identifies different modes of operation of the karaoke player and the second row from the top represents the categories of values in the table: Output 1 (OT1), Output 2 (OT2), Gain in the adjustable gain amplifier stage (Ga), gain in the fixed gain amplifier stage (Gf), and the amplified output (AO).

When the karaoke player is in audio mode, a first output, Output 1 "OT1", has a signal "S" from the DVD/CD reader; a second output, Output 2 (OT2) has a logic signal of "On;" the adjustable gain amplifier stage has a gain of "Ga," the fixed gain amplifier stage has a gain of "Gf," and the amplified output "AO" is represented by the product (OT1)GfGa. In one embodiment, assuming Gf=2, Ga=1, and OT1=S, then AO=2S.

When the karaoke player is in karaoke mode but its output is without a contribution from the external microphone, the signal on OT1 has a value of "S/2" because the signal from the DVD/CD reader is correspondingly reduced by the MPEG decoder or the gain controller, as described above. OT2 is switched "Off", resulting in an amplification increase by a factor of two, giving the adjustable gain amplifier stage a gain of "2Ga". With the fixed gain amplifier stage having a fixed gain of "Gf", the amplified output has the equivalent value of "(OT1)2GaGf". In the same embodiment, assuming Gf=2, Ga=1, and OT1=S/2, then AO=2S. In other words, when there is no contribution from the external microphone, even in the karaoke mode, the DVD/CD reader output is same as in normal audio operation mode. In some embodiments, this may occur when the MPEG decoder or the processor senses that the external microphone is electrically coupled to the MPEG decoder.

When the karaoke player is in karaoke mode and its output has a contribution from both the external microphone and the DVD/CD reader, the signal on OT1 has a value of "S/2+V". OT2 remains switched "Off" in the karaoke mode, resulting in an amplification increase by a factor of two, giving the adjustable gain amplifier stage a gain of "2Ga". With the fixed gain amplifier stage having a fixed gain of "Gf", the amplified output has the equivalent value of "SGaGf+2VGaGf". In some embodiments, assuming Gf=2, Ga=1, and OT1=S/2+V, then AO=2S+4V. Thus, when there is a contribution from the external microphone, the external microphone signal portion of the output is amplified by a factor that is about twice the amplification factor for the DVD/CD signal portion of the output.

In other embodiments, a configurable amplifier may have other configurations of circuitry that adjust gain in response to a logic signal. For instance, the logic signal may be used to activate or deactivate a part of the circuit and to thereby affect the gain of the configurable circuit.

Figure 5:
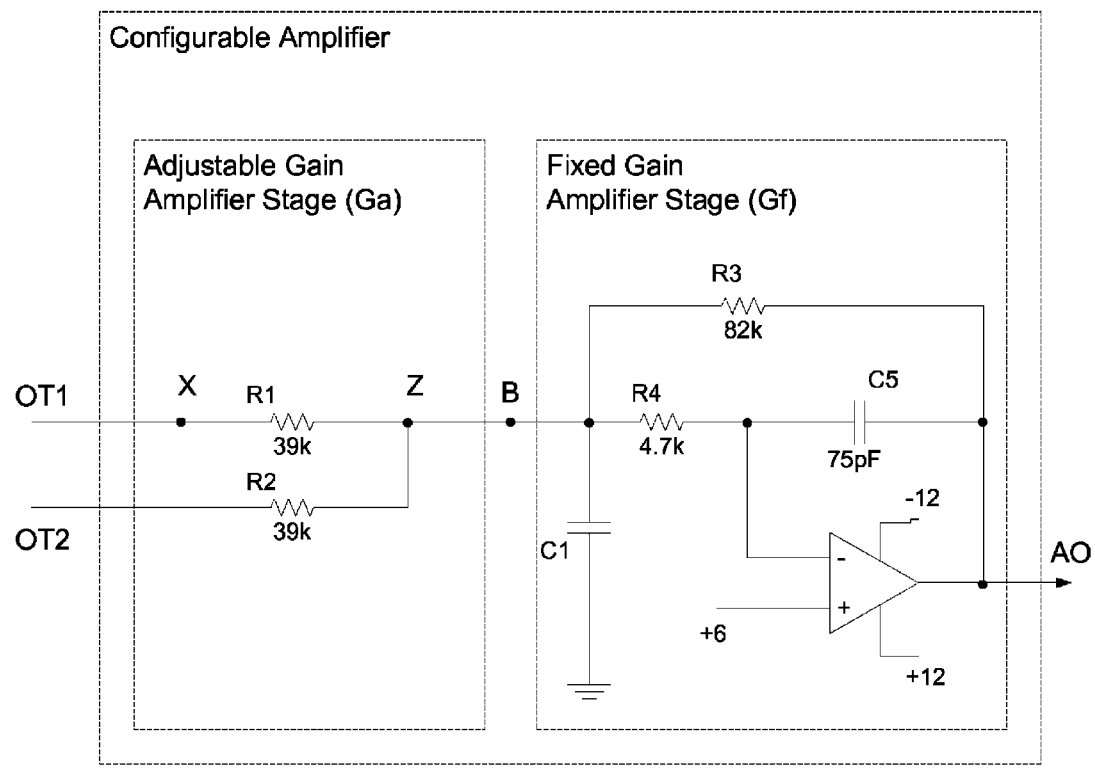
FIG. 5 depicts an example of configurable amplifier circuitry having two analog inputs, and an adjustable gain amplifier followed by a fixed gain amplifier in accordance with some embodiments.

FIG. 5 depicts an example of a configurable amplifier having two analog inputs. This amplifier can be viewed as having an adjustable gain amplifier (having a gain of Ga) and a fixed gain amplifier (having a gain of Gf) connected in series. Instead of an adjustable gain amplifier stage being controlled by a logic signal, the amplifier circuitry of FIG. 5 is controlled by the absence or presence of a second analog signal.

In some embodiments, the fixed gain amplifier stage (GO of FIG. 5 is similar to the fixed gain amplifier stage (GO of FIG. 4. The difference between the embodiment shown in FIG. 5 and the embodiment shown in FIG. 4 is that in FIG. 5 both inputs from the output terminals, OT1 and OT2, are analog signals. In the configurable amplifier of FIG. 5, the gain of the configurable amplifier is directly related to the ratio of resistances in the two stages of the configurable amplifier. As in the circuit of FIG. 4, an increase in gain of the amplifier circuitry of FIG. 5 is accomplished by a reduction in resistance in the first stage of the circuit. Furthermore, the gain is indirectly controlled by the presence or absence of signal OT2, as explained next.

Referring to FIG. 5, in a first (audio only) mode of operation, the OT2 is set to a high impedance state, and therefore the resistance between points X and Z is the same as R1, 39 k. Consequently, the overall gain of the configurable amplifier is approximately about two (e.g. 82 k/39 k). In a second (karaoke) mode of operation, the value of OT2 is set to be the same as OT1, the resistance between the source (OT1 and OT2) and point Z is reduced by a factor of two (e.g., from 39 k to 19.5 k) because the resistors R1 and R2 are connected in parallel to each other. Thus, the ratio of resistances is doubled compared with the first mode, and the overall gain of the configurable amplifier is increased to approximately four (e.g., 82 k/19.5 k). The discussion, above, of how the configurable amplifier of FIG. 4 is used in conjunction with an MPEG decoder to meet the Dolby signal to noise ratio requirement is equally applicable to the configurable amplifier of FIG. 5.

FIG. 6B is a table representing values at different points or portions of a signal flow path, in which an audio signal is amplified by the circuitry illustrated in FIG. 5. For purposes of this example, it is assumed that the MPEG decoder and the configurable amplifier are embedded in a karaoke player having multiple modes of operation. The table in FIG. 6B represents values of the circuit when both of the outputs (OT1 and OT2) of the MPEG decoder are analog signals. The left most column of the table in FIG. 6B identifies different modes of the karaoke player, and the second row from the top represents the categories of values in the table: Output 1 (OT1), Output 2 (OT2), Gain in the adjustable gain amplifier stage (Ga), gain in the fixed gain amplifier stage (Gf), and the amplified output (AO).

When the karaoke player is in audio mode, a first output, Output 1 "OT1", has a signal "S" from the DVD/CD reader, a second output, Output 2 "OT2" does not have a signal, the adjustable gain amplifier stage has a gain of "Ga", the fixed gain amplifier stage has a gain of "Gf", and the amplified output "AO" has the equivalent value of "(OT1)GfGa". In one embodiment, assuming Gf=2, Ga=1, OT1=S, and OT2=0, then AO=2S.

When the karaoke player is in karaoke mode but its output is without a contribution from the external microphone, the signal on OT1 has a value of "S/2" because the signal from the DVD/CD reader is correspondingly reduced. OT2 also has the same "S/2" value as OT1, resulting in an amplification increase by a factor of two, giving the adjustable gain amplifier stage a gain of "2Ga". With the fixed gain amplifier stage having a fixed gain of "Gf", the amplified output has the equivalent value of "(OT1)2GaGf". In the same embodiment, assuming Gf=2, Ga=1, OT1=S/2, and OT2=S/2, then AO=2S. In other words, when there is no contribution from the external microphone, even in the karaoke mode, the DVD/CD reader output is the same as in normal audio operation mode.

As noted above, in the karaoke mode of operation, the signal from the DVD/CD reader is reduced by a predetermined factor (e.g., two) in the MPEG decoder. In some embodiments this reduction and the factor of reduction are either predetermined in the MPEG or controlled by the processor. In some embodiments, this may occur when the MPEG decoder or the processor senses that the external microphone is electrically coupled to the MPEG decoder.

When the karaoke player is in karaoke mode and its output has a contribution from the external microphone and the DVD/CD reader, both OT1 and OT2 have outputs of "S/2+V". As explained above, the karaoke mode causes an amplification increase by a factor of two by decreasing the resistance of the first amplifier stage. This gives the adjustable gain amplifier stage a gain of "2Ga". With the fixed gain amplifier stage having a fixed gain of "Gf", the amplified output has the equivalent value of "SGaGf+2VGaGf". In some embodiments, assuming Gf=2, Ga=1, OT1=S/2+V, and OT2=S/2+V, then AO=2S+4V. Thus, when there is a contribution from the external microphone, the external microphone signal portion of the output is amplified by a factor that is about twice the amplification factor for the DVD/CD signal portion of the output.

Figure 7:
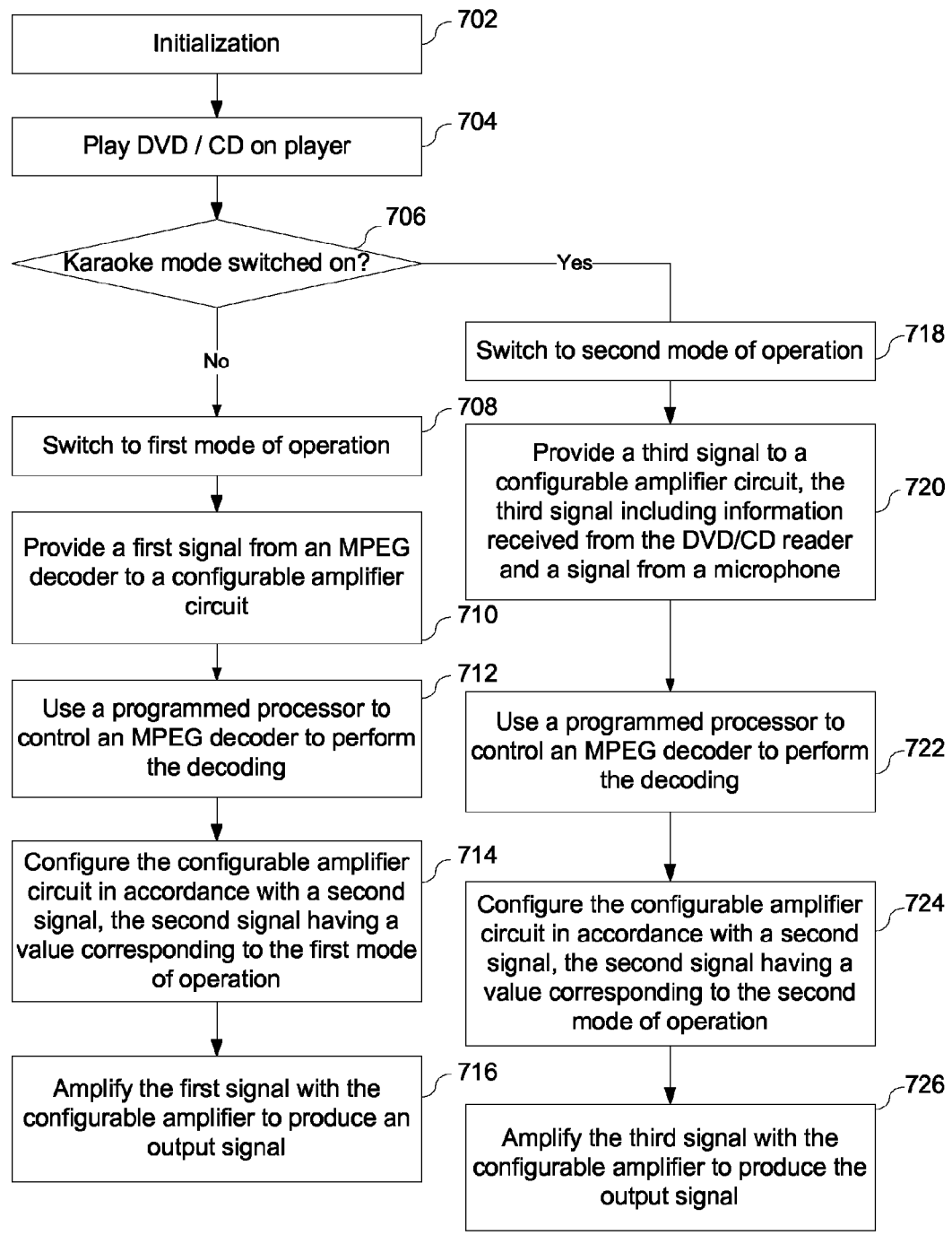
FIG. 7 is a flow chart illustrating the process of amplifying a signal output using a configurable amplifier in accordance with some embodiments of the present invention.

FIG. 7 is a flow chart illustrating a process of amplifying a signal output using a configurable amplifier in accordance with some embodiments. The DVD/CD player is initialized (702), and a DVD or CD is played on the karaoke player (704). The karaoke player determines if the player is switched to "karaoke mode" (706). In some embodiments, the karaoke player is switched to the karaoke mode if an external microphone is electrically coupled or connected to the MPEG decoder or karaoke player. In some other embodiments, the karaoke player is switched to the karaoke mode by a user or though automatic microphone level detection. If the player is not in the karaoke mode (706-No), the karaoke player adopts or switches to a first mode of operation (708), sometimes called an audio player mode. A first signal is provided from an MPEG decoder to a configurable amplifier circuit (710). For example, the first signal may be a signal from a DVD/CD reader. A programmed processor is used to control the MPEG decoder to perform the decoding (712). The configurable amplifier is further configured in accordance with a second signal from the MPEG decoder, the second signal having a value corresponding to the first mode of operation (714). In one embodiment, the second signal is a logic signal with a value corresponding to the first mode of operation. In another embodiment, the second signal is an analog signal with a value corresponding to the first mode of operation. Regardless of whether the second signal is a logic signal or an analog signal, the second signal functions to adjust the gain of the configurable amplifier in accordance with the first mode of operation. Once the level of amplification or gain of the configurable amplifier circuit is determined, the first signal is amplified by the configurable circuit to produce an output signal (716).

If the karaoke mode is switched on (706-Yes), the karaoke player adopts or switches to a second mode of operation (718). A third signal is provided to a configurable amplifier circuit that may include both decoded information received from the DVD/CD reader and a signal from the external microphone unit (720). In some embodiments, the combining of information from the DVD/CD reader and a signal from a microphone occurs in the MPEG decoder. In some embodiments, the decoding of the DVD/CD information by the MPEG decoder is controlled by a programmed processor (722). A second signal having a value corresponding to the second mode of operation is used to configure the configurable amplifier circuit (724). Once the level of amplification or gain of the configurable amplifier is determined, the third signal is amplified by the configurable amplifier to produce the output signal (726).

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An apparatus, comprising:
a DVD/CD reader port for coupling to a DVD/CD reader;
a microphone input to receive audio signals from an external microphone;
an MPEG decoder coupled to the DVD/CD reader port and the microphone input, the MPEG decoder having first and second output terminals;
a processor coupled to the MPEG decoder, the processor to control the MPEG decoder; and
a configurable amplifier coupled to the first and second output terminals of the MPEG decoder, wherein a first audio signal originating from the first output terminal is selectively amplified by the configurable amplifier circuit in accordance with a second signal originating from the second output terminal, wherein:
when the external microphone is electrically coupled to the apparatus via the microphone input, the second signal has a first state indicating the presence of the external microphone and the first audio signal comprises a combination of information from the DVD/CD reader and a signal from the external microphone; and
when the external microphone is not electrically coupled to the apparatus via the microphone input, the second signal has a second state indicating the absence of the external microphone and the first audio signal comprises information from the DVD/CD reader.

2. The apparatus of claim 1 wherein the second signal has a state that is controlled by presence and absence of the external microphone.

3. The apparatus of claim 1 wherein the configurable amplifier circuit further comprises an adjustable gain amplifier stage controlled by the second signal and a fixed gain amplifier stage.

4. The apparatus of claim 3 wherein the adjustable gain amplifier stage is in series with the fixed gain amplifier stage.

5. The apparatus of claim 3 wherein the external microphone, DVD/CD reader, the MPEG decoder, the processor, and the configurable amplifier are components of a karaoke player.

6. The apparatus of claim 5 wherein the selectable gain stage is set to a gain of more than one when the karaoke player is in karaoke mode.

7. The apparatus of claim 5 wherein the selectable gain stage is set to a gain of one when the karaoke player is in DVD or CD mode without receiving audio signals from the external microphone.

8. The apparatus of claim 3 wherein the selectable gain stage is set to a gain of more than one when the microphone input is receiving audio signals from the external microphone.

9. The apparatus of claim 3 wherein when the first signal is originated from a single source, the second signal has a value corresponding to a first mode and an amplified output of the configurable amplifier circuit has a signal to noise ratio meeting a predefined Dolby signal-to-noise requirement.

10. The apparatus of claim 3 wherein when the first signal is originated from multiple sources that include the external microphone, the second signal has a value corresponding to a second mode and an amplified output of the configurable amplifier circuit has a signal to noise ratio that fails a predefined Dolby signal-to-noise requirement.

11. The apparatus of claim 3 where the processor controls a mode of operation of the MPEG decoder and the mode of operation of the MPEG decoder controls a gain of the adjustable gain amplifier stage.

12. The apparatus of claim 11 wherein the processor configures the second signal into a first value corresponding to a first mode of operation and configures the second signal into a second value corresponding to a second mode of operation so as to selectively control the gain of the adjustable gain amplifier stage.

13. The apparatus of claim 11, wherein the processor includes circuitry to reduce a contribution to the first signal from a first source in response to an event.

14. The apparatus of claim 1 wherein the MPEG decoder further includes an internal direct digital amplification (DDX) audio digital to analog converter (DAC) having an output coupled to the first output terminal of the MPEG decoder.

15. The apparatus of claim 1 wherein the second signal is a logic signal that controls a portion of the configurable amplifier circuit.

16. The apparatus of claim 1 wherein the second signal is an analog signal same as the first signal in a first mode of operation.

17. A method to amplify an output of an apparatus, comprising:
  determining whether an external microphone is electrically coupled to an microphone input terminal of the apparatus;
  in response to determining that the apparatus is in a first mode of operation in which the external microphone is not electrically coupled to the microphone input terminal of the apparatus:
    providing a first signal to a configurable amplifier circuit, including decoding information received from a DVD or CD reader to produce a first audio signal, the first signal including the first audio signal;
    configuring the configurable amplifier circuit in accordance with a second signal, the second signal having a value corresponding to the first mode of operation;
    using a programmed processor, controlling an MPEG decoder to perform the decoding; and
    amplifying the first signal with the configurable amplifier circuit to produce an output signal; and
  in response to determining that the apparatus is in a second mode of operation in which the external microphone is electrically coupled to the microphone input terminal of the apparatus:
    providing a third signal to a configurable amplifier circuit, including decoding information received from the DVD or CD reader to produce the first audio signal and receiving an output from the microphone unit comprising a second audio signal, the third signal including a combination of the first audio signal and the second audio signal;
    configuring the configurable amplifier circuit in accordance with the second signal, the second signal having a value corresponding to the second mode of operation;
    using the programmed processor, controlling the MPEG decoder to perform the decoding; and
    amplifying the third signal with the configurable amplifier circuit to produce the output signal.

18. The method of claim 17 wherein the configurable amplifier circuit further comprises an adjustable gain stage controlled by the second output and a fixed gain amplifier stage.

19. The method of claim 18 wherein the adjustable gain stage is in series with the fixed gain amplifier stage.

20. The method of claim 18 further comprising setting the second signal to a logic zero value in the first mode of operation and to a logic one value in the second mode of operation.

21. The method of claim 17 further comprising:
  in the second mode of operation in which the external microphone is electrically coupled to the microphone input terminal of the apparatus, reducing the first audio signal by pre-determined factor.

22. The method of claim 17 further comprising:
  in the second mode of operation in which the external microphone is electrically coupled to the microphone input terminal of the apparatus, configuring the second signal to be same as the third signal.

23. The method of claim 17 further comprising configuring the second signal in accordance with instructions from the programmed processor.

24. The method of claim 17 wherein the first mode of operation is an audio listening mode and the second mode of operation is a karaoke mode.

* * * * *